United States Patent
Uehara

(10) Patent No.: US 12,404,586 B2
(45) Date of Patent: *Sep. 2, 2025

(54) SUBSTRATE ROTATING APPARATUS, PROCESSING SYSTEM, AND PROCESSING METHOD

(71) Applicant: SANTEC HOLDINGS CORPORATION, Aichi (JP)

(72) Inventor: Noboru Uehara, Aichi (JP)

(73) Assignee: SANTEC HOLDINGS CORPORATION, Aichi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/723,129

(22) PCT Filed: Jun. 23, 2023

(86) PCT No.: PCT/JP2023/023385
§ 371 (c)(1),
(2) Date: Jun. 21, 2024

(87) PCT Pub. No.: WO2024/262029
PCT Pub. Date: Dec. 26, 2024

(65) Prior Publication Data
US 2025/0116000 A1  Apr. 10, 2025

(51) Int. Cl.
*C23C 16/458* (2006.01)

(52) U.S. Cl.
CPC .............................. *C23C 16/4584* (2013.01)

(58) Field of Classification Search
CPC .................................................. C23C 16/4584
(Continued)

(56) References Cited

U.S. PATENT DOCUMENTS

| 3,128,205 A | 4/1964 | Illsley |
| 4,034,704 A * | 7/1977 | Wossner ............... C23C 14/505 |
| | | 118/730 |

(Continued)

FOREIGN PATENT DOCUMENTS

| CN | 108396302 A * | 8/2018 | ........... C23C 14/505 |
| CN | 117995642 A * | 5/2024 | |

(Continued)

OTHER PUBLICATIONS

International Search Report for International Application No. PCT/JP2023/023385 dated Sep. 12, 2023.
(Continued)

*Primary Examiner* — Charlee J. C. Bennett
(74) *Attorney, Agent, or Firm* — Meunier Carlin & Curfman LLC

(57) ABSTRACT

A substrate rotating apparatus includes a main rotation mechanism, an auxiliary rotation mechanism, and a guide structure. The main rotation mechanism rotates around a first rotation shaft. The main rotation mechanism includes the auxiliary rotation mechanism. The auxiliary rotation mechanism revolves about the first rotation shaft, and rotates around a second rotation shaft. The second rotation shaft is displaced in a circumferential direction with respect to a third rotation shaft provided between the first rotation shaft and the second rotation shaft. The guide structure has a contact surface extending in a circumferential direction with respect to the first rotation shaft. The guide structure controls displacement of the second rotation shaft in the circumferential direction with respect to the third rotation shaft, and causes the auxiliary rotation mechanism to perform the revolving motion in an orbit along the contact surface.

11 Claims, 11 Drawing Sheets

(58) Field of Classification Search
USPC .......................................................... 118/730
See application file for complete search history.

(56) References Cited

U.S. PATENT DOCUMENTS

| | | | |
|---|---|---|---|
| 4,501,766 A | | 2/1985 | Suzuki et al. |
| 5,002,011 A | | 3/1991 | Ohmine et al. |
| 5,106,346 A | * | 4/1992 | Locher ...................... F16H 1/22 |
| | | | 475/11 |
| 6,457,864 B1 | | 10/2002 | Chang et al. |
| 12,152,297 B2 | * | 11/2024 | Uehara ............. H01L 21/68764 |
| 2002/0129475 A1 | * | 9/2002 | Tsai .................... C23C 16/4586 |
| | | | 29/25.01 |
| 2003/0221466 A1 | * | 12/2003 | Hyatt, Jr. ........... G07C 9/00658 |
| | | | 70/379 R |
| 2012/0145080 A1 | * | 6/2012 | Park ........................ C23C 16/46 |
| | | | 269/57 |
| 2019/0338421 A1 | * | 11/2019 | Zong ....................... B05D 3/147 |
| 2024/0093358 A1 | | 3/2024 | Uehara |

FOREIGN PATENT DOCUMENTS

| | | |
|---|---|---|
| DE | 4025659 A1 | 2/1992 |
| JP | S58132755 A | 8/1983 |
| JP | 06-88227 A | 3/1994 |
| JP | H06088227 A | 3/1994 |
| JP | H06192835 A | 7/1994 |
| JP | 2006-63391 A | 3/2006 |
| JP | 2006330656 A | 12/2006 |
| JP | 2008-121103 A | 5/2008 |
| JP | 2015-98618 A | 5/2015 |
| JP | 2016-122788 A | 7/2016 |
| KR | 2011072905 A | 6/2011 |
| KR | 10-1292399 B1 | 8/2013 |
| KR | 20220069084 A | 5/2022 |
| WO | 2021/075074 A1 | 4/2021 |

OTHER PUBLICATIONS

Written Opinion for International Application No. PCT/JP2023/023385 dated Sep. 12, 2023.
Office Action issued in Korean Application No. 10-2024-7015485 dated Nov. 18, 2024.
International Search Report in Application No. PCT/JP2020/014868, mailed on Jun. 23, 2020.
Written Opinion of the International Searching Authority in Application No. PCT/JP2020/014868, mailed Apr. 28, 2022.
English Translation of Office Action issued in Chinese Patent Application No. 202080071635.4, dated Apr. 27, 2023.
Office Action issued in U.S. Appl. No. 17/768,060, dated Mar. 26, 2024.
Machine English Translation of Office Action issued in German Patent Application No. 112020005064.5, dated Apr. 24, 2024.
Machine English Translation of Office Action issued in Korean Patent Application No. 10-2022-7013902, dated May 7, 2024.
Office Action issued on Feb. 14, 2025, in the corresponding German Patent Application No. 112023000735.7.
Office Action issued on Mar. 27, 2025, in the corresponding Taiwanese Patent Application No. 113123254.

* cited by examiner

SUBSTRATE ROTATING APPARATUS, PROCESSING SYSTEM, AND PROCESSING METHOD

TECHNICAL FIELD

The present disclosure relates to a substrate rotating apparatus, a processing system, and a processing method.

BACKGROUND ART

A thin film vapor deposition device is already known which comprise a lens holder that rotatably holds two or more lenses in order to form thin films with uniform thickness on the lenses (see, for example, Patent Document 1). In this thin film vapor deposition device, when the lens holder rotates, the lenses are rotated on the lens holder by a planetary gear mechanism. Accordingly, the lenses revolve in accordance with rotation of the lens holder, while rotating on their own axes.

PRIOR ART DOCUMENTS

Patent Documents

Patent Document 1: Japanese Unexamined Patent Application Publication No. H06-192835

SUMMARY OF THE INVENTION

Problems to be Solved by the Invention

In film forming devices used in optical and semiconductor fields, it is generally preferable that a uniform thin film can be formed on a substrate. If a thin film with a uniform film thickness can be formed on a large substrate, costs related to film formation can be reduced, and the productivity of product can be improved.

However, a film material to be emitted as scattered particles from a film material source such as a vapor deposition source has a non-uniform spatial distribution with respect to a substrate. The non-uniformity worsens as an attempt is made to form a thin film on a large area of the substrate.

For this reason, the film thickness of the thin film with non-uniform thickness formed on the substrate has been conventionally made uniform by using a film thickness correction plate. However, the method for making a film thickness uniform using a film thickness correction plate requires mounting the film thickness correction plate on the substrate with high precision, and further requires remaking the film thickness correction plate in accordance with the spatial distribution of scattered particles.

As in the cited document 1, also by a technique of revolving and rotating a substrate such as a lens, which is an object of film formation, during the film formation, it is possible to form a substantially uniform thin film on the substrate while reducing influence of the non-uniform spatial distribution of the scattered particles. However, even this technique leaves room for improvement of the uniformity of the thin film. In addition, if a complex mechanical structure is employed for improved uniformity of the thin film, the weight of the device may increase and the durability may deteriorate.

Thus, according to some embodiments of the present disclosure, it is preferable that a new technique for a substrate rotating apparatus is provided which is suitable for uniform processing on a substrate, such as forming a film with uniform thickness on a substrate.

Means for Solving the Problems

According to some embodiments, a substrate rotating apparatus is provided. The substrate rotating apparatus comprises a main rotation mechanism, an auxiliary rotation mechanism, and a guide structure. The main rotation mechanism rotates around a first rotation shaft.

The main rotation mechanism comprises the auxiliary rotation mechanism. The auxiliary rotation mechanism revolves about the first rotation shaft as the main rotation mechanism rotates. The auxiliary rotation mechanism rotates around a second rotation shaft. The auxiliary rotation mechanism comprises a support structure for supporting a substrate as an object to be processed. The support structure rotates around the second rotation shaft. The second rotation shaft is displaced in a circumferential direction with respect to a third rotation shaft around the third rotation shaft. The third rotation shaft is provided between the first rotation shaft and the second rotation shaft in the main rotation mechanism.

The guide structure is provided around the first rotation shaft and controls a revolving motion of the auxiliary rotation mechanism. The guide structure has a contact surface extending in a circumferential direction with respect to the first rotation shaft. The guide structure controls displacement of the second rotation shaft in the circumferential direction with respect to the third rotation shaft, and causes the auxiliary rotation mechanism to perform the revolving motion in an orbit along the contact surface when the contact surface and the auxiliary rotation mechanism are in contact with each other.

In a conventional method of revolving and rotating on its own axis a support structure for a substrate as an object to be processed by using a planetary gear mechanism, a revolving orbit is a perfectly circular orbit. A disclosing party of the present disclosure has noticed that such circular orbit hinders uniform processing on a substrate with high precision.

In the substrate rotating apparatus according to some embodiments described above, since the guide structure enables control of the revolving orbit of the support structure, the revolving orbit is not limited to a perfectly circular orbit, unlike the planetary gear mechanism with the revolving orbit of the support structure being limited to a shape corresponding to a gear. That is, the substrate rotating apparatus according to some embodiments can achieve the revolving orbit other than the perfectly circular orbit by the guide structure having a shape other than a perfect circle.

Accordingly, some embodiments allow greater design freedom for the support structure and a rotational motion of the substrate. This design freedom enables all points on the substrate as an object to be processed to be displaced with respect to a spatial distribution related to the processing such that non-uniformity of the aforementioned spatial distribution is cancelled out. Therefore, some embodiments can provide the substrate rotating apparatus for film formation that enables uniform processing on the substrate.

According to some embodiments, the aforementioned design freedom enables all points on the substrate as an object of the film formation to be displaced with respect to a spatial distribution of the film material such that non-uniformity of the aforementioned spatial distribution is cancelled out. Therefore, some embodiments can provide the substrate rotating apparatus that enables a uniform thin film to be formed with high precision on the substrate.

According to the substrate rotating apparatus of some embodiments, in order for the third rotation shaft to be located between the first rotation shaft and the second rotation shaft, a rotation diameter between the second rotation shaft and the third rotation shaft is smaller than a rotation diameter between the second rotation shaft and the first rotation shaft.

In this case, when the second rotation shaft is displaced in the circumferential direction with respect to the third rotation shaft, a radial length between the auxiliary rotation mechanism and the first rotation shaft changes. That is, the auxiliary rotation mechanism can revolve in an orbit of other than a perfect circle along the contact surface.

Displacement of the auxiliary rotation mechanism in a radial direction with respect to the first rotation shaft by the displacement in the circumferential direction with respect to the third rotation shaft can be achieved by a relatively simple rotational structure. Therefore, according to some embodiments, a substrate rotating apparatus excellent for uniform processing on a substrate can be implemented with a simple configuration, and further with a lightweight configuration. The simple configuration may contribute to the durability of the substrate rotating apparatus. The lightweight configuration may allow high-speed rotation of the main rotation mechanism with low energy.

According to some embodiments, the contact surface may be an inner circumferential surface facing the first rotation shaft included in the guide structure. The inner circumferential surface may control radially outward displacement of the auxiliary rotation mechanism with respect to the first rotation axis.

In a rotational system of the main rotation mechanism, a radially outward centrifugal force acts on the auxiliary rotation mechanism. That is, the auxiliary rotation mechanism attempts radially outward displacement. If the displacement due to the centrifugal force is controlled by a contact with the auxiliary rotation mechanism on the inner circumferential surface of the guide structure, it is then possible to stably revolve the auxiliary rotation mechanism in an orbit along the inner circumferential surface of the guide structure, and control the revolving motion of the support structure with high precision.

According to some embodiments, the main rotation mechanism may comprise a rotation plate that rotates around the first rotation shaft. The rotation plate may have a slit along the circumferential direction with respect to the third rotation shaft. The auxiliary rotation mechanism may comprise the second rotation shaft penetrating the slit.

The auxiliary rotation mechanism may comprise a rotating table including the support structure at a first end portion of the second rotation shaft. The auxiliary rotation mechanism may comprise, at a second end portion opposite to the first end portion of the second rotation shaft, a wheel that travels on the contact surface of the guide structure. While the wheel travels on the contact surface along with the revolving motion, the wheel and the rotating table coupled via the second rotation shaft may rotate on their own axes.

According to the substrate rotating apparatus as described above, revolution and rotation along the guide structure of the auxiliary rotation mechanism can be implemented by a relatively simple mechanical structure.

According to some embodiments, the auxiliary rotation mechanism may be coupled to the main rotation mechanism via a spring that biases the auxiliary rotation mechanism in a direction to maintain contact with the contact surface. Biasing as such enables the auxiliary rotation mechanism to stably and accurately revolve along the contact surface of the guide structure.

According to some embodiments, the substrate rotating apparatus may be configured so that the auxiliary rotation mechanism performs a revolving motion about the first rotation shaft in an elliptical orbit. According to some embodiments, the contact surface of the guide structure may be arranged in an elliptical shape in the circumferential direction with respect to the first rotation shaft.

According to some embodiments, the contact surface of the guide structure may be arranged in a non-point symmetric ring shape in the circumferential direction with respect to the first rotation shaft. The auxiliary rotation mechanism may perform a revolving motion about the first rotation shaft in a non-point symmetric orbit. The revolving orbit as such is advantageous in uniform substrate processing. In particular, the revolving orbit as such is advantageous in formation of films with uniform thickness. This is because the spatial distribution of the film material shows a point symmetric distribution in many cases.

According to some embodiments, the guide structure may comprise a sliding mechanism configured to move at least part of the contact surface in the radial direction with respect to the first rotation shaft. According to the substrate rotating apparatus comprising the sliding mechanism, a user can adjust the revolving orbit via the sliding mechanism, and achieve uniform processing on the substrate with higher precision.

According to some embodiments, a processing system may be provided which comprises a processing apparatus configured to process a front surface of a substrate that rotates and revolves together with the auxiliary rotation mechanism by operation of the substrate rotating apparatus.

According to some embodiments, the processing apparatus may be configured to process the front surface of the substrate by forming a film on the front surface of the substrate.

According to some embodiments, the processing apparatus may be configured to process the front surface of the substrate by scraping the front surface of the substrate.

According to some embodiments, the processing apparatus may be configured to process the front surface of the substrate by film formation, milling, or etching.

According to some embodiments, the processing apparatus may be configured to process the front surface of the substrate by scattering a substance toward the front surface of the substrate. According to some embodiments, the substance may be a substance for film formation.

According to some embodiments, a processing method may be provided which comprises operating the aforementioned substrate rotating apparatus, and processing the front surface of the substrate that rotates and revolves together with the auxiliary rotation mechanism by operation of the substrate rotating apparatus.

EXPLANATION OF REFERENCE NUMERALS

1 . . . dielectric film vapor deposition device, 10 . . . vapor deposition source, 15 . . . container, 100 . . . substrate rotating apparatus, 110 . . . motor, 130 . . . guiding device, 131 . . . base plate, 133 . . . ball bearing, 135 . . . shaft, 137 . . . guide member, 137A . . . guide rail, 137B . . . inner circumferential surface, 137C . . . bottom plate, 137D . . . hole, 139A . . . guide rail, 141 . . . first sliding mechanism, 142 . . . second sliding mechanism, 150 . . . main rotation device, 151 . . . main rotation plate, 155 . . . shaft, 159 . . . slit, 170 . . . auxiliary rotation device, 171 . . . rotating table, 171A . . . recess, 171B . . . cavity, 175 . . . shaft, 179 . . . wheel, 179A . . . wheel-body, 179B. . . . O-ring, 180 . . . rotating mechanism, 181 . . . link, 183 . . . joint, 185 . . . spring, 190 . . . substrate rotating apparatus, 200 . . . substrate, 300, 400 . . . processing system, 301, 401 . . . processing apparatus, R1 . . . first rotation shaft, R2 . . . second rotation shaft, R3 . . . third rotation shaft, RS . . . light receiving sensor.

MODE FOR CARRYING OUT THE INVENTION

Hereinafter, some embodiments will be described with reference to the accompanying drawings.

A substrate rotating apparatus 100 of some embodiments is the substrate rotating apparatus 100 for film formation used in dielectric film vapor deposition or crystal growth. In order to assist in forming a uniform thin film on a substrate 200, the substrate rotating apparatus 100 receives power from a motor 110 to revolve and rotate on its own axis the substrate 200 as an object of the film formation to be processed.

Examples of the substrate 200 include not only optical substrates, but also substrates for manufacturing semiconductor devices. The thin film formation on the optical substrates is carried out, for example, in order to provide specified optical properties to the optical substrates. Examples of the optical substrates include not only flat substrates, but also substrates having a convex surface or a concave surface.

Figure 1:
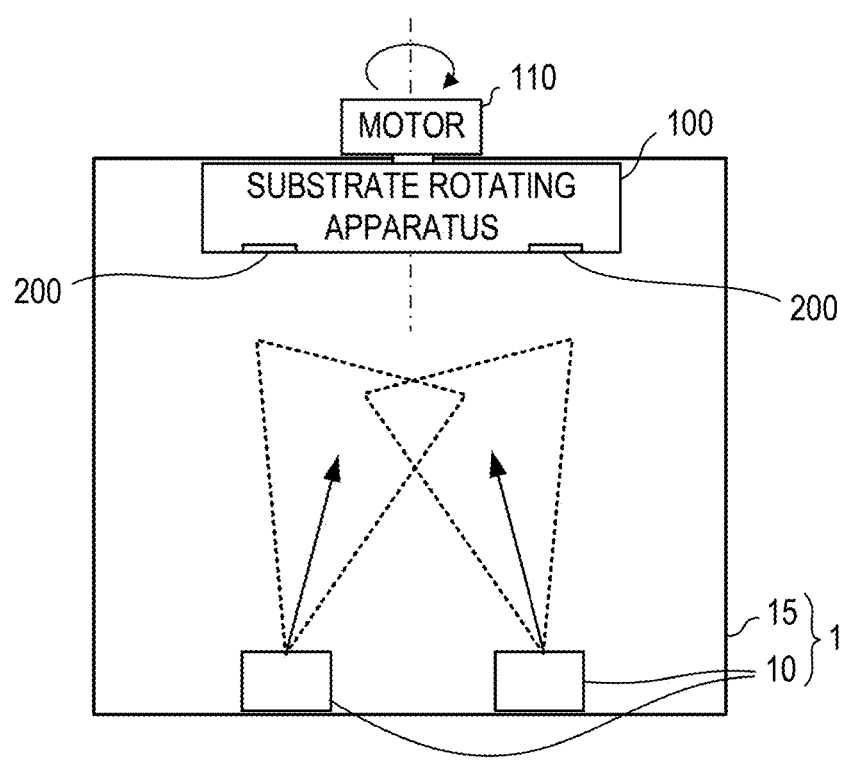
FIG. 1 is a conceptual diagram of a dielectric film vapor deposition device comprising a substrate rotating apparatus in some embodiments.

For example, as shown in FIG. 1, the substrate rotating apparatus 100 is arranged within a container 15 of a dielectric film vapor deposition device 1 including two or more vapor deposition sources 10. In the substrate rotating apparatus 100, a surface of the substrate 200 as an object of the film formation faces the vapor deposition sources 10.

The substrate rotating apparatus 100 receives power from the motor 110, thereby to revolve and rotate on its own axis the substrate 200 within the container 15. The container 15 is maintained in a vacuum state. In this state, a film material is vaporized from the vapor deposition source 10, and the vaporized film material scatters as scattered particles within the container 15. In FIG. 1, broken lines conceptually illustrate a spread of the scattered particles, and arrows conceptually illustrate directions where the scattered particles flow.

When the scattered particles are attached on the substrate 200, a thin film is formed on the substrate 200. When different kinds of thin films are stacked on the substrate 200, the two or more vapor deposition sources 10 operate in order. Each of the vapor deposition sources 10, when operating, vaporizes and scatters a corresponding film material so that the corresponding kind of thin film is formed on the substrate 200.

A spatial distribution of the film material scattered from each of the vapor deposition sources 10 to the substrate 200 has a substantially point symmetric geometric shape. The closer to the center the film materials, the greater the amount of the film materials scattered. The farther from the center the film materials, the smaller the amount of the film materials scattered.

Accordingly, a film thickness $\lambda$ of the thin film formed on the substrate 200 generally shows a distribution in accordance with a function $\lambda = T(r) = T0 + k1 \cdot r + k2 \cdot r^2 + k3 \cdot r^3 + \ldots$, that is, the distribution in accordance a univariate polynomial having a distance r from the center as a single variable. In a case where the thin film formation is performed in a state where the substrate 200 does not rotate and is stationary, the coefficients k1, k2, k3, . . . are determined in accordance with a scattering distribution of the film material.

In the substrate rotating apparatus 100 in some embodiments, the substrate 200 is revolved and rotated on its own axis, whereby all points on the substrate 200 are displaced with respect to the scattering distribution of the film material. This brings the coefficients k1, k2, k3 . . . closer to zero, and forms a homogeneous thin film, which shows the distribution T(r) having only a constant term T0 and the uniform film thickness $\lambda$ irrespective of distance, in a large area of the substrate 200.

The substrate rotating apparatus 100 forms a more uniform thin film than before by achieving a non-point symmetric revolving orbit that is not a perfect circle, such as an ellipse. For this revolving orbit, the substrate rotating apparatus 100 is configured as shown in FIG. 2.

Figure 2:
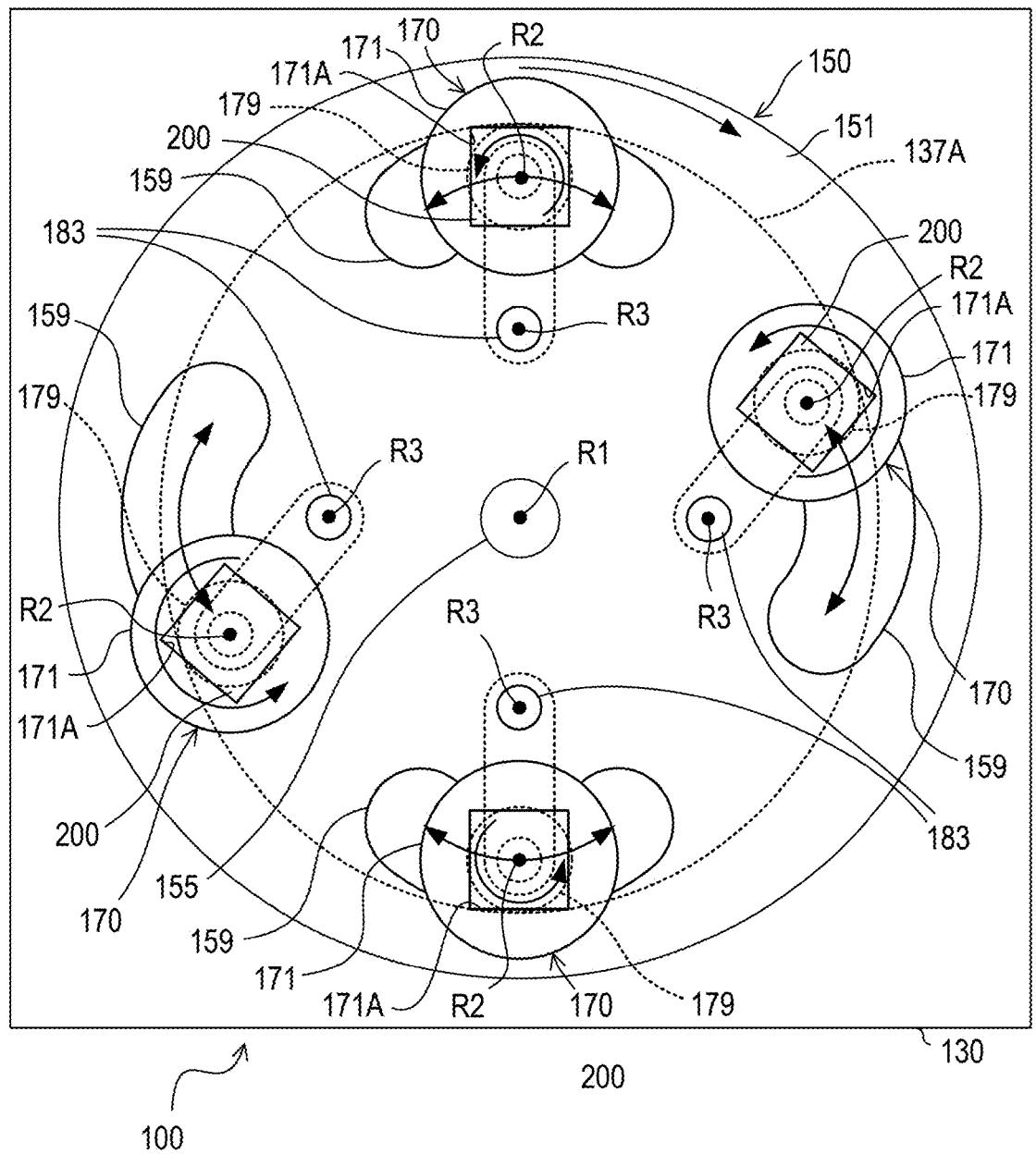
FIG. 2 is a schematic plan view of the substrate rotating apparatus in some embodiments.

The substrate rotating apparatus 100 shown in FIG. 2 comprises a guiding device 130, a main rotation device 150 mounted on the guiding device 130, and two or more auxiliary rotation devices 170 mounted on the main rotation device 150.

Broken lines in FIG. 2 indicate a portion located behind a front surface of the substrate rotating apparatus 100 in a transparent manner. Arrows in FIG. 2 indicate that the main rotation device 150 performs a rotational motion around a first rotation shaft R1, that the rotating table 171 of the auxiliary rotation device 170 performs a rotational motion around a second rotation shaft R2, and that the rotating table 171 is circumferentially displaceable around a third rotation shaft R3.

Figure 3:
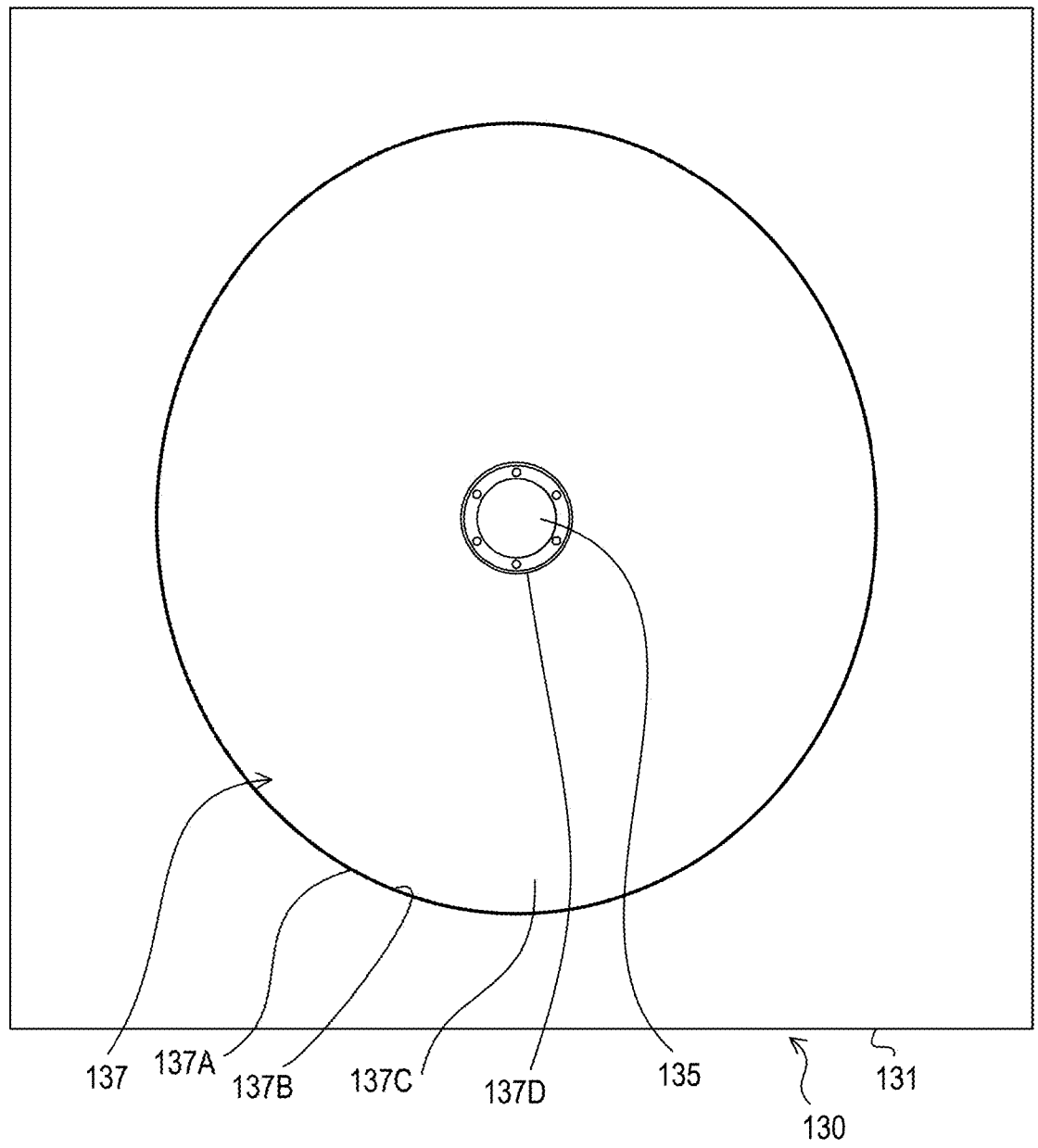
FIG. 3 is a schematic plan view of a guiding device in some embodiments.
Figure 4:
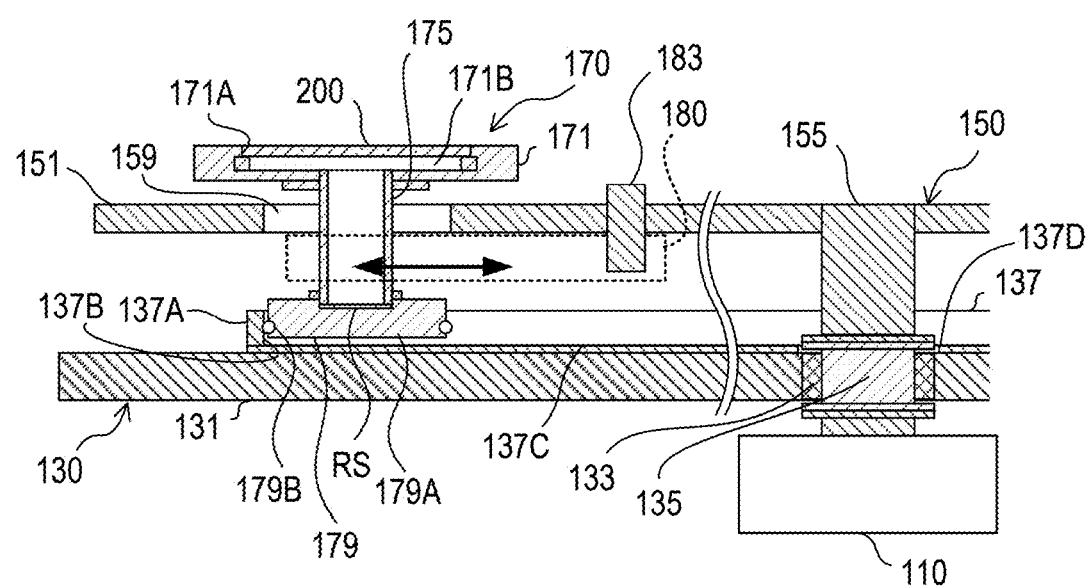
FIG. 4 is a schematic cross-sectional view of the substrate rotating apparatus along rotation shafts in some embodiments.

As shown in FIGS. 3 and 4, the guiding device 130 comprises a base plate 131, a shaft 135 rotatably held by the base plate 131 via a ball bearing 133, and a guide member 137.

The guide member 137 comprises a guide rail 137A and a bottom plate 137C having a peripheral edge of the same shape as that of the profile of the guide rail 137A. As shown in FIG. 4, the guide rail 137A protrudes from the peripheral edge of the bottom plate 137C.

The bottom plate 137C has a hole 137D for the shaft 135 to pass through. The guide member 137 is fixed to the base plate 131 via, for example, a screw, with the shaft 135 penetrating the hole 137D.

The guide rail 137A is arranged around the shaft 135 in a non-point symmetric ring shape in a state where the guide member 137 is fixed to the base plate 131. In an example shown in FIG. 3, the guide rail 137A has a circumferentially elliptical profile.

The main rotation device 150 is rotatably held with respect to the guiding device 130. As shown in FIGS. 2 and 4, the main rotation device 150 comprises a main rotation plate 151 and a shaft 155. The shaft 155 extends from the center of the main rotation plate 151 toward the guiding device 130 in a normal direction of the main rotation plate 151. The shaft 155 is coupled to the main rotation plate 151, and further to a first end of the shaft 135 of the guiding device 130.

The shaft 135 has a second end protruding through a back surface of the guiding device 130. The motor 110 is coupled to the second end of the shaft 135. As a result, the main rotation device 150 is arranged over the guiding device 130 such that the main rotation plate 151 receives power from the motor 110 to rotate around the shaft 155. The shaft 155 corresponds to the first rotation shaft R1.

As shown in FIG. 2, the main rotation plate 151 comprises slits 159 extending in a circumferential direction with respect to the third rotation shaft R3 and spaced at intervals of 90 degrees. The number of the auxiliary rotation devices 170 is the same as that of the slits 159. Each of the auxiliary rotation devices 170 penetrates the corresponding one of the slits 159.

Figure 5:
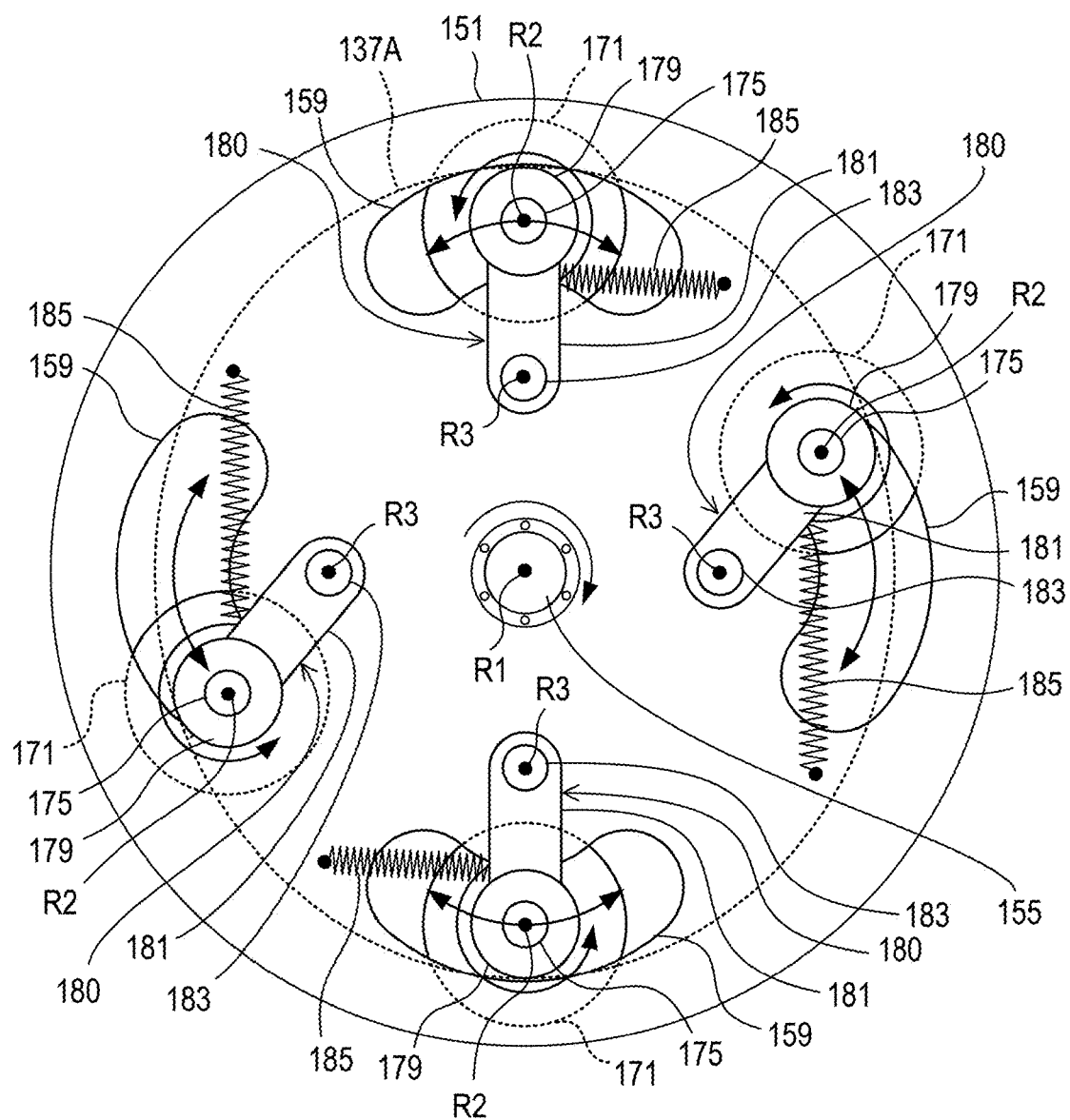
FIG. 5 is a schematic rear view of a main rotation device on which an auxiliary rotation device is mounted in some embodiments.

As shown in FIGS. 2, 4, and 5, each of the auxiliary rotation devices 170 comprises the rotating table 171, a shaft 175, a wheel 179, and a rotating mechanism 180. The rotating mechanism 180 is arranged at a position corresponding to a broken line in FIG. 4. That is, the rotating mechanism 180 is provided on a back surface of the main rotation plate 151. In FIG. 4, details of the rotating mechanism 180 are not shown.

The shaft 175 is provided to penetrate the slit 159 and the rotating mechanism 180. The rotating mechanism 180 supports the shaft 175 so that the shaft 175 is rotatable about its axis. The shaft 175 corresponds to the second rotation shaft R2.

In addition, the rotating mechanism 180 supports the shaft 175 so that the shaft 175 is rotatable along the slit 159, especially displaceable in the circumferential direction with respect to the third rotation shaft R3.

As shown in FIG. 5, the rotating mechanism 180 comprises a link 181 configured to rotatably support the shaft 175, a joint 183 configured to support the link 181 in a manner displaceable in the circumferential direction with respect to the third rotation shaft R3, and a spring 185.

The joint 183 is provided in the main rotation plate 151 so as to penetrate the main rotation plate 151 in a normal direction, and is thereby erected in the normal direction on the back surface of the main rotation plate 151. The link 181 has a hole (not shown) that the joint 183 penetrates at a first end portion. The link 181 is supported by the joint 183 in a manner displaceable in a circumferential direction with respect to the joint 183 via the hole. This causes the link 181 to be attached to the main rotation plate 151 in a manner displaceable in the circumferential direction with respect to the third rotation shaft R3 around the third rotation shaft R3.

In one example, a shaft ball bearing may be provided between the joint 183 and the link 181. As a result, the link 181 may be held by the joint 183 so as to be smoothly displaceable in a circumferential direction around the joint 183.

The link 181 further has a hole (not shown) that the shaft 175 penetrates at a second end portion that is farther from first rotation shaft R1 than the first end portion. The link 181 supports the shaft 175 so that the shaft 175 is rotatable about its axis. As a result, the shaft 175 is attached to the rotating mechanism 180 in a manner rotatable around the second rotation shaft R2 that is displaced in the circumferential direction with respect to the third rotation shaft R3. In one example, a shaft ball bearing may be provided between the shaft 175 and the link 181. This allows the shaft 175 to be supported by the link 181 so as to be smoothly rotatable.

Figure 6A:
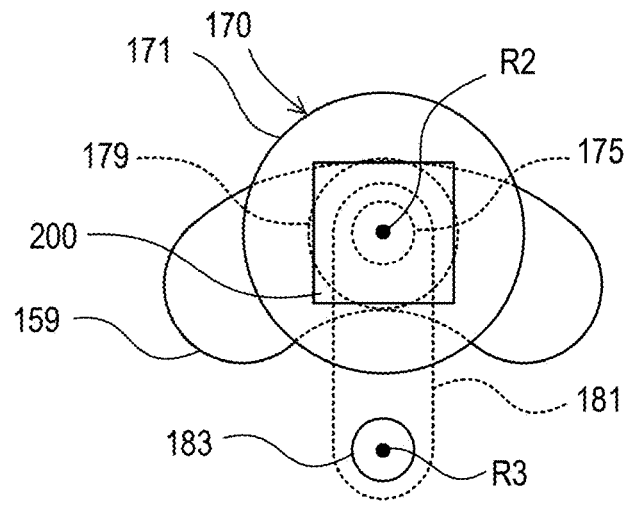
FIGS. 6A and 6B are explanatory views for circumferential displacement of a rotating table along a slit provided in a main rotation plate in some embodiments.
Figure 6B:
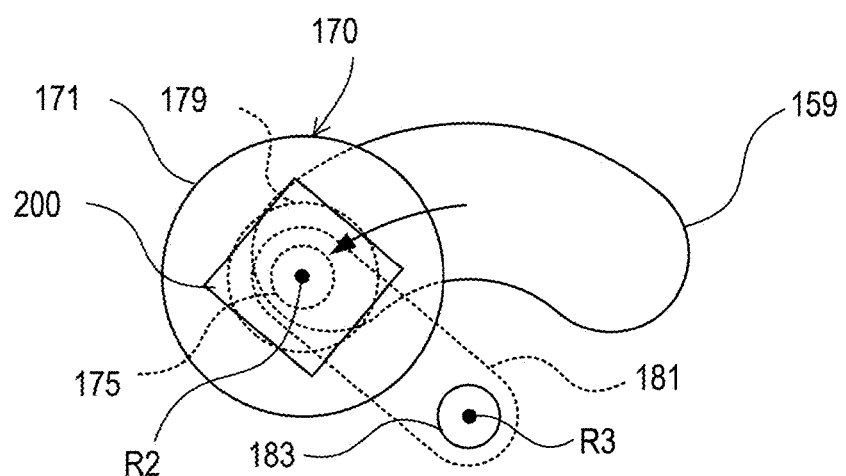

The slit 159 provided in the main rotation plate 151 is an arc-shaped slit curved along the circumferential direction with respect to the third rotation shaft R3. The shaft 175 is held in the link 181 so that a length from the third rotation shaft R3, that is, a rotation diameter with respect to the third rotation shaft R3, corresponds to a distance from the third rotation shaft R3 to the center of a slit 159. As a result, as shown in FIGS. 6A and 6B, the shaft 175 is arranged along the slit 159 in a manner displaceable in the circumferential direction with respect to the third rotation shaft R3.

The spring 185 is provided between the link 181 and the main rotation plate 151 so that a first end portion of the spring 185 is fixed to the link 181 and a second end portion of the spring 185 is fixed to the main rotation plate 151.

As shown in FIGS. 2 and 4, the third rotation shaft R3 is located between the first rotation shaft R1 and the second rotation shaft R2 in a radial direction with respect to the first rotation shaft R1. A rotation diameter between the second rotation shaft R2 and the third rotation shaft R3 is smaller than a rotation diameter between the second rotation shaft R2 and the first rotation shaft R1.

Accordingly, when the shaft 175 is displaced in the circumferential direction along the slit 159, a radial length between the shaft 175 and the first rotation shaft R1 changes.

The spring 185 is provided between the link 181 and the main rotation plate 151 so as not to apply a biasing force to the link 181 when the shaft 175 is in a circumferential center position of the slit 159, that is, a position where a radial distance from the first rotation shaft R1 is the longest. In other words, the spring 185 is coupled to the link 181 so that a biasing force in a direction to return the shaft 175 to the center position is applied to the link 181 when the shaft 175 moves away from the center position.

As shown in FIG. 4, a first end portion of the shaft 175 protrudes from a front surface of the main rotation plate 151. The first end portion of the shaft 175 is coupled to a center of the rotating table 171 on a back side of the rotating table 171. As a result, the rotating table 171 is arranged on the front side of the main rotation plate 151 in a state rotatable around the shaft 175, and, as shown in FIGS. 6A and 6B, in a state displaceable in the circumferential direction with respect to the third rotation shaft R3 as the shaft 175 moves.

As described above, the rotation diameter between the shaft 175 and the third rotation shaft R3 is smaller than the rotation diameter between the shaft 175 and the first rotation shaft R1. Thus, the rotating table 171 is arranged over the main rotation plate 151 in a manner displaceable in a radial direction of the first rotation shaft R1 as the shaft 175 moves in the circumferential direction with respect to the third rotation shaft R3.

As shown in FIG. 2, the rotating table 171 has a circular profile, and comprises on its front side a support structure that supports a rectangular substrate 200. Specifically, the rotating table 171 has a rectangular recess 171A, of which shape corresponds to that of the substrate 200, on the front side (see FIG. 4), and supports the substrate 200 fitted in the recess 171A.

As shown in FIG. 4, the rotating table 171 has a hollow internal structure, and supports an edge of the substrate 200 from a back side of the substrate 200. The shaft 175 coupled to the rotating table 171 is a hollow cylindrical member. A cavity 171B of the rotating table 171 communicates with a second end portion opposite to the first end portion of the shaft 175.

The second end portion of the shaft 175 is located on a back side of the main rotation plate 151. A light receiving sensor RS is provided at the second end portion of the shaft 175 so as to cover an opening of the shaft 175. The light receiving sensor RS receives a measurement light that is emitted from above the substrate 200 and propagates through the substrate 200 and the cavity 171B, and outputs a signal corresponding to a light intensity of the received measurement light. The signal output from the light receiving sensor RS is used to measure a thickness of a thin film formed on the substrate 200.

The second end portion of the shaft 175 is coupled to a center of the wheel 179. Since the rotating table 171 is coupled to the first end portion of the shaft 175, and the wheel 179 is coupled to the second end portion of the shaft 175 as such, the rotating table 171 rotates around the shaft 175 (that is, rotates on its own axis) in accordance with rotation of the wheel 179.

With respect to the wheel 179, an O-ring 179B is attached to a side wall of a wheel-body 179A having a circular profile. The wheel 179 is arranged at a height where the O-ring 179B is in contact with an inner circumferential surface 137B of the guide rail 137A so that the wheel 179 travels on the inner circumferential surface 137B of the guide rail 137A.

That is, when the main rotation plate 151 rotates, the wheel 179 travels on the inner circumferential surface 137B of the guide rail 137A in accordance with a revolving motion of the rotating table 171 caused by rotation of the main rotation plate 151.

The spring 185 is provided so that the wheel 179, when traveling, can safely travel on the inner circumferential surface 137B of the guide rail 137A, without being separated from, and even slipping on, the inner circumferential surface 137B of the guide rail 137A.

Due to the arrangement of the spring 185, the wheel 179 receives a tension having a component directing radially outward of the main rotation plate 151 from the spring 185 via the shaft 175, and is pressed against the inner circumferential surface 137B of the guide rail 137A so as to maintain the contact with the inner circumferential surface 137B of the guide rail 137A.

That is, the wheel 179 receives a radially outward biasing force from the spring 185, and is pressed against the inner circumferential surface 137B of the guide rail 137A. As a result, the wheel 179 revolves on an orbit along the guide rail 137A while rotating on its own axis in a state where there is substantially no slipping on the inner circumferential surface 137B of the guide rail 137A or separation from the guide rail 137A.

Figure 7A:
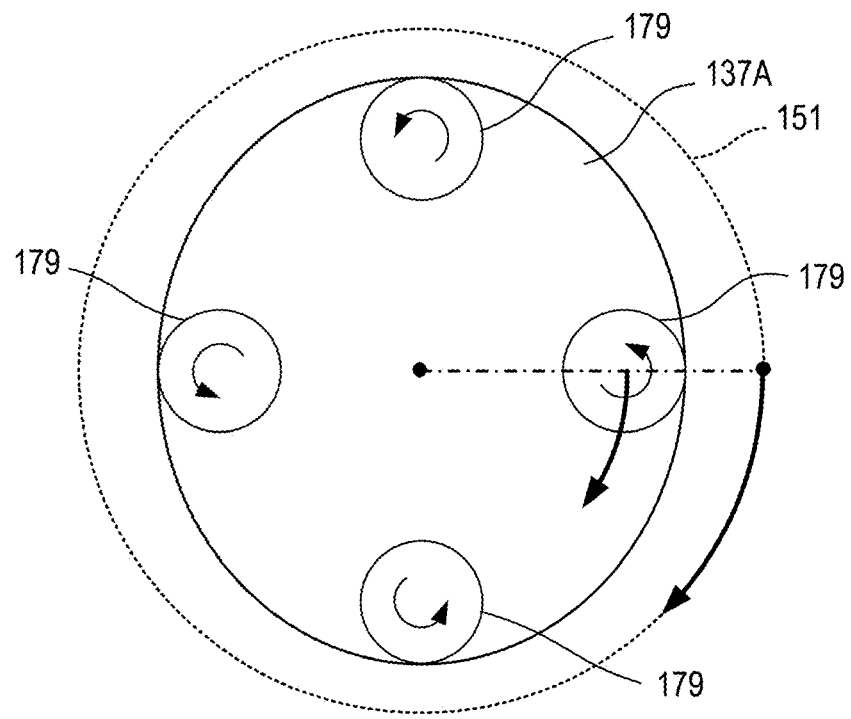
FIGS. 7A and 7B are explanatory views for revolving and rotational motions in some embodiments.
Figure 7B:
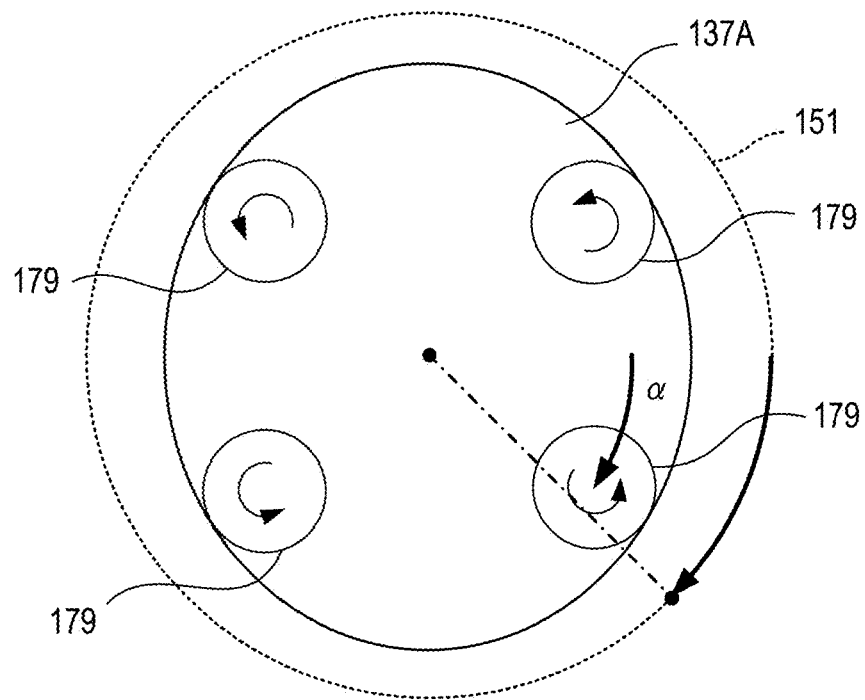

When the guide rail 137A is elliptical as shown in FIG. 3, the wheel 179 of the auxiliary rotation device 170 and the rotating table 171 that works together rotate on their own axes while revolving in an elliptical orbit as shown in FIGS. 7A and 7B. When the main rotation plate 151 is rotated by an angle α in a direction of arrow with the wheel 179 being arranged as shown in FIG. 7A, the wheel 179 moves to a position shown in FIG. 7B while tracing an elliptical orbit. In FIGS. 7A and 7B, the main rotation plate 151 is shown by broken lines.

During the rotation of the main rotation plate 151, positions of the rotating table 171 and the wheel 179 in a radial direction of the main rotation plate 151 are controlled to positions along the guide rail 137A by a centrifugal force, the biasing force by the spring 185, and a dynamic action from the guide rail 137A to the wheel 179 accompanied by reaction force. That is, the guide rail 137A controls positions of the wheel 179 and the shaft 175 in the radial direction by the contact with the wheel 179 of the auxiliary rotation device 170, and thereby controls the revolving motion of the rotating table 171.

The substrate rotating apparatus 100 in some embodiments rotates on its own axis the rotating table 171 that supports the substrate 200 while revolving the rotating table 171 along a non-point symmetric elliptical orbit, by the control of the revolving orbit using the guide rail 137A. Such revolution and rotation cause complex displacement of all points on the substrate 200 such that the points traverse the non-uniform spatial distribution of the film material from the vapor deposition source 10, and enables a thin film with uniform thickness to be formed on the front surface of the substrate 200.

Figure 8:
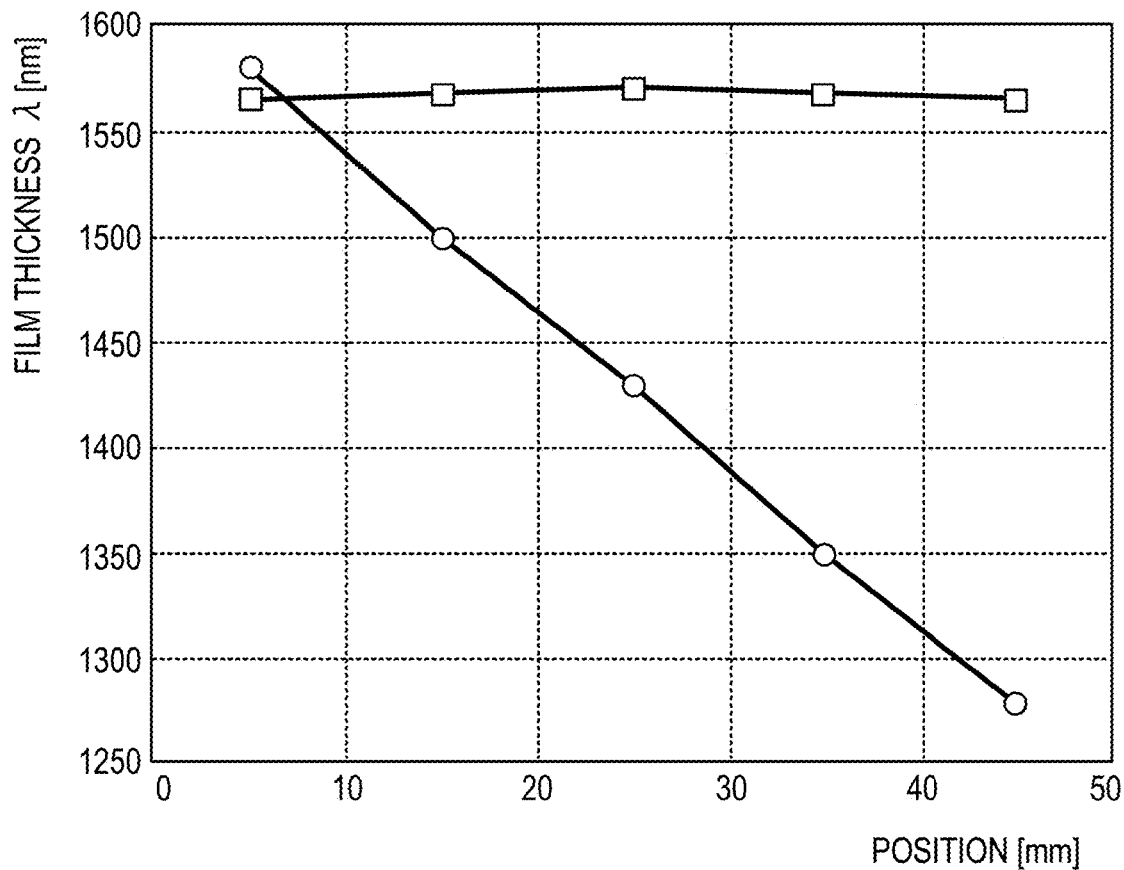
FIG. 8 is a graph showing experimental results regarding a film thickness.

A graph in FIG. 8 shows measurement results for comparison experiment. In the comparative experiment, a substrate holding base fixed so as not to move with respect to the main rotation plate 151 is provided between two adjacent auxiliary rotation devices 170 on the main rotation plate 151. In that state, while the substrate rotating apparatus 100 was rotated, thin film formation was performed. A film thickness λ of the substrate 200 held by the rotating table 171 and a film thickness λ of the substrate 200 held by the substrate holding base were measured.

A horizontal axis in the graph indicates a position of the front surface of the substrate 200. A vertical axis in the graph indicates the film thickness λ of the thin film formed on the front surface of the substrate 200. A line chart plotted with circular symbols indicates the spatial distribution of the film thickness λ on the substrate 200 mounted on the substrate holding base. A line chart plotted with rectangular symbols indicates the spatial distribution in the film thickness λ on the substrate 200 mounted on the rotating table 171 in some embodiments. As described above, it can be understood that a thin film with a uniform thickness (λ) can be formed on the substrate 200 with extremely high precision in the substrate rotating apparatus 100 of some embodiments.

As explained above, in the substrate rotating apparatus 100 in some embodiments, the main rotation device 150 corresponding to a main rotation mechanism rotates around a first rotation shaft R1 (shafts 135, 155).

The rotating table 171, the shaft 175, and the wheel 179 of the auxiliary rotation device 170 corresponding to an auxiliary rotation mechanism revolve about the first rotation shaft R1 (shafts 135, 155) as the main rotation plate 151 rotates, and rotate around a second rotation shaft R2 (shaft 175) on its own axis. The rotating table 171, the shaft 175, and the wheel 179 are provided to the main rotation plate 151.

In the auxiliary rotation device 170, the rotating table 171 comprising a support structure (recess 171A) of the substrate 200 rotates around the second rotation shaft R2 (shaft 175), and further, the second rotation shaft R2 (shaft 175) is displaced in the circumferential direction with respect to the third rotation shaft R3. The third rotation shaft R3 (joint 183) is provided between the first rotation shaft R1 (shafts 135, 155) and the second rotation shaft R2 (shaft 175) in the main rotation plate 151. Accordingly, with the circumferential displacement, the second rotation shaft R2 (shaft 175) is displaced in the radial direction with respect to the first rotation shaft R1.

The guide rail 137A constituting a guide structure includes an inner circumferential surface 137B used for controlling the revolving motion of the rotating table 171. The inner circumferential surface 137B extends in the circumferential direction with respect to the first rotation shaft R1 (shafts 135, 155), has a non-point symmetric ring-shaped profile, and faces the first rotation shaft R1.

The guide rail 137A brings the inner circumferential surface 137B into contact with the wheel 179 of the auxiliary rotation device 170, and regulates displacement of the wheel 179 radially outward of the main rotation plate 151. This regulation causes the guide rail 137A to control a circumferential displacement of the second rotation shaft R2 (shaft 175) and the rotating table 171 along the slit 159, and a resulting displacement in the radial direction with respect to the first rotation shaft R1, such that the rotating table 171 performs the revolving motion in an orbit corresponding to the inner circumferential surface 137B (an orbit along the inner circumferential surface 137B).

As described above, the substrate rotating apparatus 100 in some embodiments enables the rotating table 171 to perform the non-point symmetric revolving motion while rotating on its own axis without employing a film thickness correction plate or a planetary gear mechanism, and displaces all points of the substrate 200 with respect to the spatial distribution of the film material scattered from the vapor deposition sources 10. Accordingly, as it can be understood from the experimental results as well, the uniform thin film with high precision can be formed on the front surface of the substrate 200.

In the film formation using the planetary gear mechanism, it is difficult to remove an influence of even function terms of the function T(r), that is, an influence of $r^n$ term with an even order n by making the coefficient closer to zero, since the revolving orbit is perfectly circular. On the other hand, in some embodiments, the rotating table 171 can be rotated in the non-point symmetric elliptical revolving orbit. Therefore, the influence of even function terms can be removed, and thus, the uniform film thickness λ can be achieved.

Also, in the film formation using the planetary gear mechanism, when two or more vapor deposition sources 10 having different spatial distributions of scattered particles are used, it was difficult to make thin films to be uniformly formed in each of the vapor deposition sources 10, since the revolving orbit is perfectly circular. According to the substrate rotating apparatus 100 in some embodiments, such non-uniformity can be reduced. That is, the substrate rotating apparatus 100 can make the thin films formed using each of the two or more vapor deposition sources 10 more uniform than before.

In addition, vibration is likely to be generated during rotation in the planetary gear mechanism. According to the substrate rotating apparatus 100 in some embodiments, vibration during rotation can be also reduced. Vibration reduction as such contributes to high precision film thickness formation.

In some embodiments, the revolving orbit is controlled not by a gear but using the guide rail 137A. Thus, a relatively large-scale substrate rotating apparatus 100 can be easily manufactured, and a system can be built which can form films with uniform thickness on a large substrate 200. Therefore, according to some embodiments, costs related to film formation can be reduced, and productivity of product can be improved.

In some embodiments, the wheel 179 of the auxiliary rotation device 170 is pressed against the inner circumferential surface 137B of the guide rail 137A, using the biasing force and the centrifugal force by the spring 185, so as not to be separated from, or further to slip on, the inner circumferential surface 137B. Then, the rotation of the wheel 179 is used to rotate the rotating table 171 around the second rotation shaft R2 (shaft 175). This allows high precision control of the rotational motion of the substrate 200, and high precision formation of thin films.

In some embodiments, the rotating mechanism 180 holds the second rotation shaft R2 in a manner movable in the circumferential direction with respect to the third rotation shaft R3 by the link mechanism, and thereby in a manner displaceable in the radial direction with respect to the first rotation shaft R1. Thus, with the simple configuration, the rotating table 171 can be held in a manner displaceable in the radial direction with respect to the first rotation shaft R1. Accordingly, a lightweight and durable substrate rotating apparatus 100 can be manufactured. Being lightweight is also advantageous in that the main rotation plate 151 can be rotated in high speed with less energy.

According to some embodiments, various revolving orbits other than the elliptical orbit shown in FIG. 3 can be easily achieved by changing a circumferential shape of the guide rail 137A. Ellipticity is not limited to the example shown in FIG. 3. For example, the revolving orbit may have any ellipse with an ellipticity a/b of 0.99 or less, where a is the shortest distance in the ellipse, and b is the longest distance in the ellipse.

Figure 9:
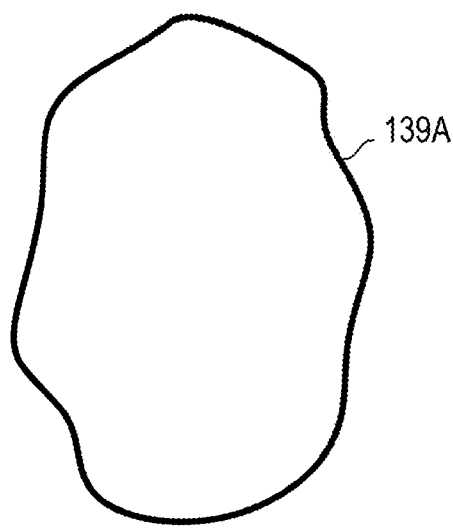
FIG. 9 is a diagram showing a circumferential profile of a guide rail in some embodiments.

As shown in FIG. 9, the guide rail 137A may be replaced with a guide rail 139A having a non-point symmetric ring-shaped profile other than the elliptical profile. The guide rail 139A may be arranged so as to circumferentially meander on the base plate 131.

Two or more guide members 137 including guide rails having different shapes may be prepared, and these guide members 137 may be alternately fixed to the base plate 131. As a result, the substrate rotating apparatus 100 can achieve a very wide variety of revolving motions.

Figure 10:
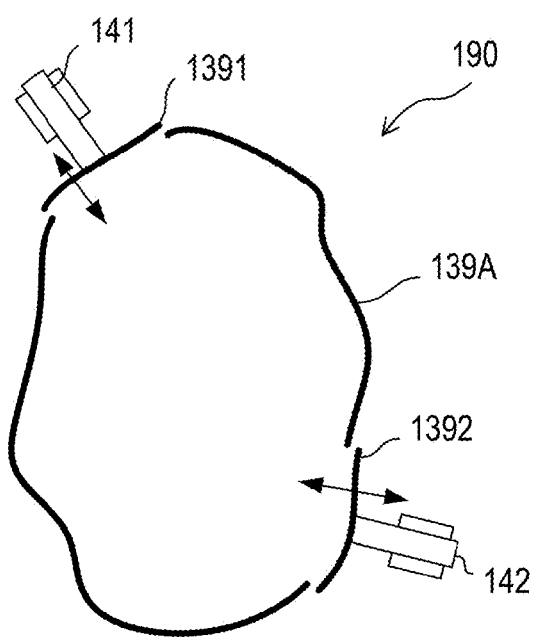
FIG. 10 is a diagram showing a configuration of the guide rail comprising sliding mechanisms in some embodiments.

The substrate rotating apparatus 100 may be provided with a mechanism configured to move the guide rails 137A, 139A. As shown in FIG. 10, a substrate rotating apparatus 190 comprises a first sliding mechanism 141 and a second sliding mechanism 142. The first sliding mechanism 141 slides a first portion 1391 of a guide rail 139A in a radial direction with respect to a first rotation shaft. The second sliding mechanism 142 slides a second portion 1392 of the guide rail 139A in the radial direction with respect to the first rotation shaft. The first sliding mechanism 141 and the second sliding mechanism 142 are arranged on the base plate 131 of the guiding device 130. The first portion 1391 and the second portion 1392 of the guide rail 139A are separated from the bottom plate and other portions of the guide rail 139A.

The substrate rotating apparatus 190 can be configured similarly to the substrate rotating apparatus 100 of the aforementioned embodiment, except that the portions of the guide rail 139A are configured to be movable and that the substrate rotating apparatus 190 comprises the first and second sliding mechanisms 141, 142. According to the substrate rotating apparatus 190, since the revolving orbit of the rotating table 171 can be adjusted for uniform film thickness, thin films can be formed with higher precision.

According to some embodiments, the substrate rotating apparatus 100 is arranged within the container 15 of the dielectric film vapor deposition device 1 comprising two or more vapor deposition sources 10. The dielectric film vapor deposition device 1 corresponds to a processing system for film formation, and the two or more vapor deposition source 10 correspond to a processing apparatus.

Figure 11A:
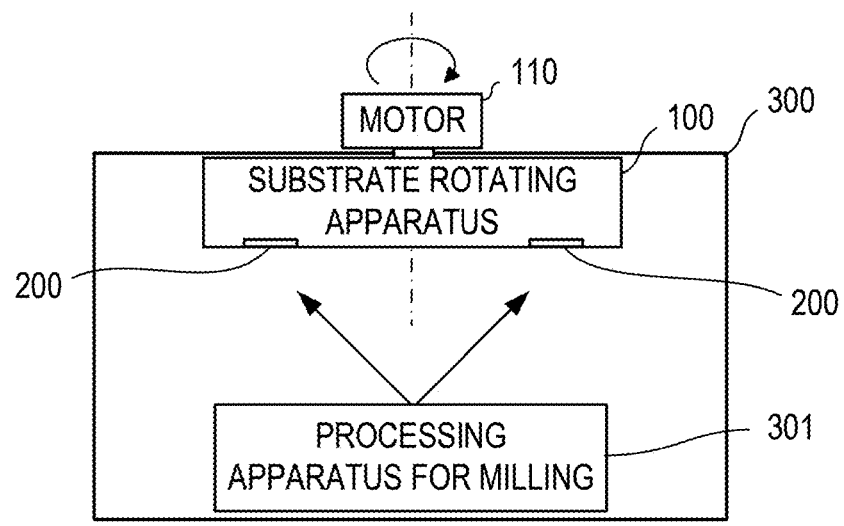
FIGS. 11A and 11B are conceptual diagrams showing a configuration of a processing system in some embodiments.

According to some embodiments, the substrate rotating apparatus 100 may be mounted to the processing system 300 for milling, as shown in FIG. 11A. Then, the substrate rotating apparatus 100 may be used to rotate the substrate 200 subject to milling. The processing system 300 shown in FIG. 11A comprises the substrate rotating apparatus 100 together with a processing apparatus 301 for milling. The processing system 300 is configured to scrape, by an ion beam from the processing apparatus 301, the front surface of the substrate 200 that rotates and revolves together with the rotating table 171 by the movement of the substrate rotating apparatus 100.

Figure 11B:
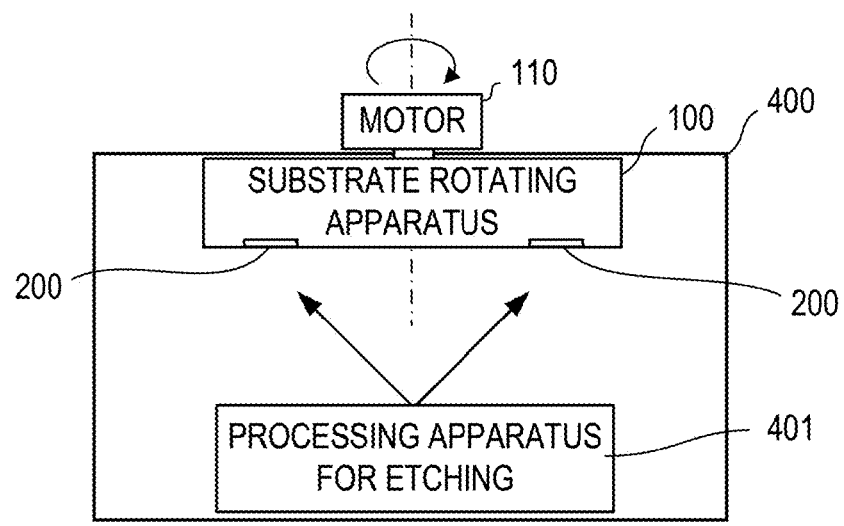

According to some embodiments, the substrate rotating apparatus 100 may be mounted to a processing system 400 for etching as shown in FIG. 11B. Then, the substrate rotating apparatus 100 may be used to rotate the substrate 200 subject to etching. The processing system 400 shown in FIG. 11B comprises the substrate rotating apparatus 100 together with a processing apparatus 401 for etching. The processing system 400 may be configured to scrape, by scattering an etching agent from the processing apparatus 301, the front surface of the substrate 200 that rotates and revolves together with the rotating table 171 by the movement of the substrate rotating apparatus 100.

Example embodiments of the substrate rotating apparatus in some embodiments have been described in the above. However, it goes without saying that the substrate rotating apparatus should not be limited to the aforementioned embodiments, and various modes can be taken.

For example, the substrate rotating apparatus 100 may not be provided with the spring 185. Without the spring 185, the wheel 179 may be sufficiently pressed onto the guide rail 137A by the centrifugal force. In addition, the substrate rotating apparatus 100 shown in the drawings is conceptual, and the size and shape of each portions of the substrate rotating apparatus 100 are not limited to those in the drawings.

Functions of one element in the aforementioned embodiments may be achieved by two or more elements. Functions of two or more elements in the aforementioned embodiments may be achieved by one element. A part of the configuration of the aforementioned embodiments may be omitted. It should be noted that any and all forms that are encompassed in the technical ideas identified by the languages in the claims are embodiments of the present disclosure.

The invention claimed is:

1. A substrate rotating apparatus for film formation comprising:
   a main rotation device including a rotation plate configured to rotate around a first rotation shaft, the rotation plate having a slit;
   an auxiliary rotation device provided on the rotation plate and configured to revolve about the first rotation shaft as the rotation plate rotates; and
   a guide rail provided around the first rotation shaft and configured to control a revolving motion of the auxiliary rotation device,
   the guide rail having a contact surface extending in a circumferential direction with respect to the first rotation shaft,
   the auxiliary rotation device comprising:
      a second rotation shaft penetrating the slit of the rotation plate;
      a rotating table for supporting a substrate as an object to be processed, the rotating table being arranged at a first end portion of the second rotation shaft; and
      a wheel traveling on the contact surface, the wheel being arranged at a second end portion opposite to the first end portion of the second rotation shaft and coupled to the rotating table via the second rotation shaft,
   the wheel and the rotating table rotating around the second rotation shaft while the wheel travels on the contact surface along with the revolving motion,
   the slit of the rotation plate provided in a circumferential direction with respect to a third rotation shaft, the third rotation shaft being provided between the first rotation shaft and the second rotation shaft,
   the second rotation shaft being displaced, along the slit, in a circumferential direction with respect to the third rotation shaft,
   the guide rail controlling displacement of the second rotation shaft in the circumferential direction with respect to the third rotation shaft, and causing the auxiliary rotation device to perform the revolving motion in an orbit along the contact surface when the contact surface and the auxiliary rotation device are in contact with each other.

2. The substrate rotating apparatus according to claim 1, wherein
   the contact surface is an inner circumferential surface facing the first rotation shaft included in the guide rail, and
   the inner circumferential surface controls radially outward displacement of the auxiliary rotation device with respect to the first rotation shaft.

3. The substrate rotating apparatus according to claim 1, wherein the auxiliary rotation device is coupled to the main rotation device via a spring that biases the auxiliary rotation device in a direction to maintain contact with the contact surface.

4. The substrate rotating apparatus according to claim 1, wherein the auxiliary rotation device performs a revolving motion about the first rotation shaft in an elliptical orbit.

5. The substrate rotating apparatus according to claim 4, wherein the contact surface is arranged in an elliptical shape in the circumferential direction with respect to the first rotation shaft.

6. The substrate rotating apparatus according to claim 1, wherein
the contact surface is arranged in a non-point symmetric ring shape in the circumferential direction with respect to the first rotation shaft, and
the auxiliary rotation device performs a revolving motion about the first rotation shaft in a non-point symmetric orbit.

7. A processing system comprising:
a substrate rotating apparatus according to claim 1; and
a processing apparatus configured to process a front surface of the substrate that rotates and revolves together with the auxiliary rotation device by operation of the substrate rotating apparatus.

8. The processing system according to claim 7, wherein the processing apparatus is configured to process the front surface of the substrate by forming a film on the front surface of the substrate or by scraping the front surface of the substrate.

9. The processing system according to claim 7, wherein the processing apparatus is configured to process the front surface of the substrate by film formation, milling, or etching.

10. The processing system according to claim 7, wherein the processing apparatus is configured to process the front surface of the substrate by scattering a substance toward the front surface of the substrate.

11. A processing method comprising: operating a substrate rotating apparatus, comprising: a main rotation device including a rotation plate configured to rotate around a first rotation shaft, the rotation plate having a slit;
an auxiliary rotation device provided on the rotation plate and configured to revolve about the first rotation shaft as the rotation plate rotates;
and a guide rail provided around the first rotation shaft and configured to control a revolving motion of the auxiliary rotation device,
the guide rail having a contact surface extending in a circumferential direction with respect to the first rotation shaft,
the auxiliary rotation device comprising: a second rotation shaft penetrating the slit of the rotation plate;
a rotating table for supporting a substrate as an object to be processed, the rotating table being arranged at a first end portion of the second rotation shaft;
and a wheel traveling on the contact surface, the wheel being arranged at a second end portion opposite to the first end portion of the second rotation shaft and coupled to the rotating table via the second rotation shaft,
the wheel and the rotating table rotating around the second rotation shaft while the wheel travels on the contact surface along with the revolving motion,
the slit of the rotation plate provided in a circumferential direction with respect to a third rotation shaft, the third rotation shaft being provided between the first rotation shaft and the second rotation shaft,
the second rotation shaft being displaced, along the slit, in a circumferential direction with respect to the third rotation shaft,
the guide rail controlling displacement of the second rotation shaft in the circumferential direction with respect to the third rotation shaft, and causing the auxiliary rotation device to perform the revolving motion in an orbit along the contact surface when the contact surface and the auxiliary rotation device are in contact with each other; and
processing a front surface of the substrate that rotates and revolves together with the auxiliary rotation device by operation of the substrate rotating apparatus.

* * * * *